United States Patent
Lee et al.

(10) Patent No.: US 9,015,644 B2
(45) Date of Patent: Apr. 21, 2015

(54) CROSSTALK ANALYSIS METHOD

(71) Applicant: Wistron Corp., New Taipei (TW)

(72) Inventors: Wen-Hsiang Lee, New Taipei (TW);
Wen-Jui Kuo, New Taipei (TW);
Feng-Ling Lin, New Taipei (TW);
Hsiao Ming Wang, New Taipei (TW);
Lung-Ming Chan, New Taipei (TW);
Li-Ting Hung, New Taipei (TW)

(73) Assignee: Wistron Corp., New Taipei (TW)

( * ) Notice: Subject to any disclaimer, the term of this patent is extended or adjusted under 35 U.S.C. 154(b) by 0 days.

(21) Appl. No.: 14/323,130

(22) Filed: Jul. 3, 2014

(65) Prior Publication Data
US 2014/0317585 A1    Oct. 23, 2014

Related U.S. Application Data

(63) Continuation-in-part of application No. 13/958,813, filed on Aug. 5, 2013.

(30) Foreign Application Priority Data

Aug. 6, 2012  (TW) .............................. 101128189 A

(51) Int. Cl.
*G06F 17/50*  (2006.01)

(52) U.S. Cl.
CPC ........ *G06F 17/5081* (2013.01); *G06F 17/5077* (2013.01); *G06F 17/5031* (2013.01); *G06F 17/5072* (2013.01); *G06F 17/5036* (2013.01)

(58) Field of Classification Search
CPC ............ G06F 17/5081; G06F 17/5031; G06F 17/5072; G06F 17/5077
USPC ......... 716/112, 108, 109, 113, 122, 123, 130, 716/136, 133, 134; 703/16
See application file for complete search history.

(56) References Cited

U.S. PATENT DOCUMENTS

| | | | | |
|---|---|---|---|---|
| 6,564,364 | B1 * | 5/2003 | Dahl et al. | 716/122 |
| 7,228,509 | B1 * | 6/2007 | Dada et al. | 716/102 |
| 7,340,696 | B1 * | 3/2008 | Jadcherla | 716/102 |
| 7,475,000 | B2 * | 1/2009 | Cook et al. | 703/14 |
| 7,590,951 | B1 * | 9/2009 | Bell et al. | 716/131 |
| 7,882,469 | B2 | 2/2011 | Budell et al. | |
| 7,970,596 | B2 * | 6/2011 | Bade et al. | 703/13 |
| 8,181,149 | B1 * | 5/2012 | Kelly et al. | 716/139 |
| 8,205,181 | B1 | 6/2012 | Singla et al. | |
| 2003/0227032 | A1 | 12/2003 | Nawa et al. | |
| 2004/0044970 | A1 * | 3/2004 | Anderson et al. | 716/1 |

(Continued)

OTHER PUBLICATIONS

Taiwanese language office action dated May 16, 2014.

(Continued)

*Primary Examiner* — Phallaka Kik
(74) *Attorney, Agent, or Firm* — McClure, Qualey & Rodack, LLP

(57) ABSTRACT

An embodiment of the disclosure provides a crosstalk analysis method executed by a computer including: executing a layout program for a layout circuit; executing a crosstalk analysis program; acquiring, by the crosstalk analysis program, a plurality of parameters from a layout result generated by the layout program; estimating a crosstalk value according to the parameters; determining whether the crosstalk value is larger than a predetermined value; providing an interface for showing information of the layout result and adjusting a plurality of lines of the layout circuit.

15 Claims, 20 Drawing Sheets

(56) References Cited

U.S. PATENT DOCUMENTS

| | | | |
|---|---|---|---|
| 2004/0255260 A1* | 12/2004 | Drapeau | 716/19 |
| 2005/0080502 A1* | 4/2005 | Chernyak et al. | 700/97 |
| 2005/0172252 A1* | 8/2005 | Cheng et al. | 716/10 |
| 2005/0204323 A1 | 9/2005 | Chen et al. | |
| 2006/0043547 A1 | 3/2006 | Kuzmenka | |
| 2007/0157150 A1* | 7/2007 | Ogami et al. | 716/16 |
| 2009/0055787 A1 | 2/2009 | Oh et al. | |
| 2010/0070943 A1* | 3/2010 | Koga et al. | 716/18 |
| 2010/0192113 A1* | 7/2010 | Brelsford et al. | 716/5 |
| 2011/0273240 A1 | 11/2011 | Lin | |
| 2012/0278049 A1 | 11/2012 | Takashima | |

OTHER PUBLICATIONS

English language translation of relevant paragraphs of Taiwan office action.

* cited by examiner

| (0.6~3.3 V) | Rising Time (30~180 ps) | Thickness (mil) (4~12 mils) | Shift (0~32 mils) | Relative Distance (mil) = (Shift^2+Thickness^2)^0.5 | Parallel Length (100~300 mils) |
|---|---|---|---|---|---|
| 0.6 V | 30 | 4 mil | 0 | 5 | 100 mil |
| 1.2 V | 50 | 8 mil | 4 | 8 | 300 mil |
| 1.5 V | 80 | | 8 | 12 | 500 mil |
| 1.8 V | 120 | | 12 | | 700 mil |
| 3.3 V | 150 | | 16 | | |
| | | | 20 | | |

CHECKING OPTIONS

○ Check By User Select

| Selected nets | 300

Select by Net Names

Unselect Nets

Save as Group | Imo/Exo->

☐ View Selected Nets

◉ Check ALL Nets

☑ Exclude Net Name [...] 4

☐ Same Net Checking

○ Check By Signal Group

Edit/Creak
Delete
Import
Export ->

☐ View Include Nets

CHECK BY DIRTY NET

Import Dirty Power List

```
┌─ PARAMETERS ─────────────────────────┐
│                                       │
│  Layer Pair 1:    [_____ ▽]       │
│                   [_____ ▽]       │
│  Dielectric Thickness                 │
│                                       │
│  Layer Pair 2:    [_____ ▽]       │
│                   [_____ ▽]       │
│  Dielectric Thickness                 │
│                                       │
│  [✓] Victim NR (%)  [10]   [...]     │
│  [ASSIGN NR REF]  300                 │
│  [ ] Auto set DEFAULT to found nets   │
│  [ ] Use Allegro Parallel Length      │
│  [ ] Exclude SEGS <   [1.0]          │
│  [✓] with Pin Counts <=  [5   ▽]    │
│                                       │
│  (◉) Distance Value <  [3W  ▽]      │
│  ( ) Shift Value <     [8   ▽]      │
│                                       │
│       Parallel Length >  [200.0 ▽]  │
│                                       │
└───────────────────┬───────────────────┘
                    │
                    53

| Seg Length | NR | OK | Y | N |
|---|---|---|---|---|
| V3SS1 (LS1) | × | | | |
| V3SS2 (LS2) | | | | |
| V3SS3 (LS3) | × | | | |
| ⋮ | ⋮ | ⋮ | ⋮ | ⋮ |
| V3SSN (LSN) | | | | |

1272

CROSSTALK ANALYSIS METHOD

CROSS REFERENCE TO RELATED APPLICATIONS

This application is a Continuation-In-Part of pending U.S. patent application Ser. No. 13/958,813 filed Aug. 5, 2013 and entitled "Crosstalk Analysis Method," which claims priority of Taiwan Patent Application No. 101128189, filed on Aug. 6, 2012, the entirety of which is incorporated by reference herein.

BACKGROUND

1. Field

The present disclosure relates to a crosstalk analysis method, and more particularly, to a crosstalk analysis method in a dual stripe line difference layer.

2. Description of the Related Art

Nowadays, lighter and thinner electronic products are a trend. The functions of electronic products are variable and complex. Due to the mechanical limitations and cost limitations of the electronic products, one way to achieve lighter and thinner electronic products, is to reduce the thickness of the printed circuit board of electronic products, while increasing the number of layers. However, these types of designs cause high speed signal interference on the printed circuit board. Thus, the quality of the electronic products manufactured thereby is not easily controlled and defects of the electronic products are not easily detected.

BRIEF SUMMARY OF THE DISCLOSURE

An embodiment of the disclosure provides a crosstalk analysis method executed by a computer including: executing a layout program for a layout circuit; executing a crosstalk analysis program; acquiring, by the crosstalk analysis program, a plurality of parameters from a layout result generated by the layout program; estimating a crosstalk value according to the parameters; determining whether the crosstalk value is larger than a predetermined value; providing an interface for showing information of the layout result and adjusting a plurality of lines of the layout circuit.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein:

FIG. 3 is a schematic diagram showing a form format in a database that provides parameters for calculating a crosstalk according to an embodiment of the disclosure.

FIG. 5A shows an interface of a crosstalk analysis program according to another embodiment of the disclosure.

FIG. 5B shows an interface of a crosstalk analysis program according to another embodiment of the disclosure.

FIG. 5C shows an interface of a crosstalk analysis program according to another embodiment of the disclosure.

FIG. 7B shows an interface of a crosstalk analysis program according to another embodiment of the disclosure.

DETAILED DESCRIPTION OF THE DISCLOSURE

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
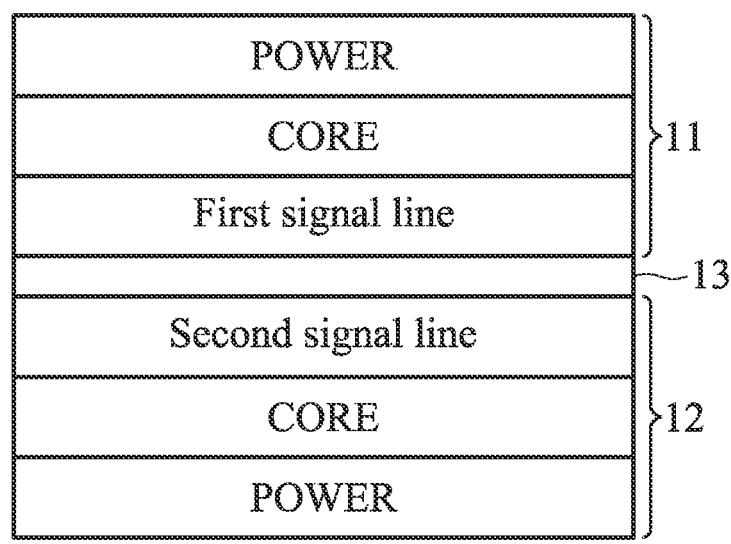
FIG. 1 is a schematic diagram showing a layout of dual stripeline difference layers.

Of the current circuit designs, the dual stripeline difference layer design easily generates interference between lines. The interference is the so-called crosstalk. FIG. 1 is a schematic diagram showing a layout of dual stripeline difference layers. In FIG. 1, the layout of the dual stripeline difference layers comprises a first layer 11, a second layer 12 and an adhesion layer 13. When a first signal line in the first layer 11 and a second signal line in the second layer 12 transmit signals simultaneously, it easily causes crosstalk.

Figure 2:
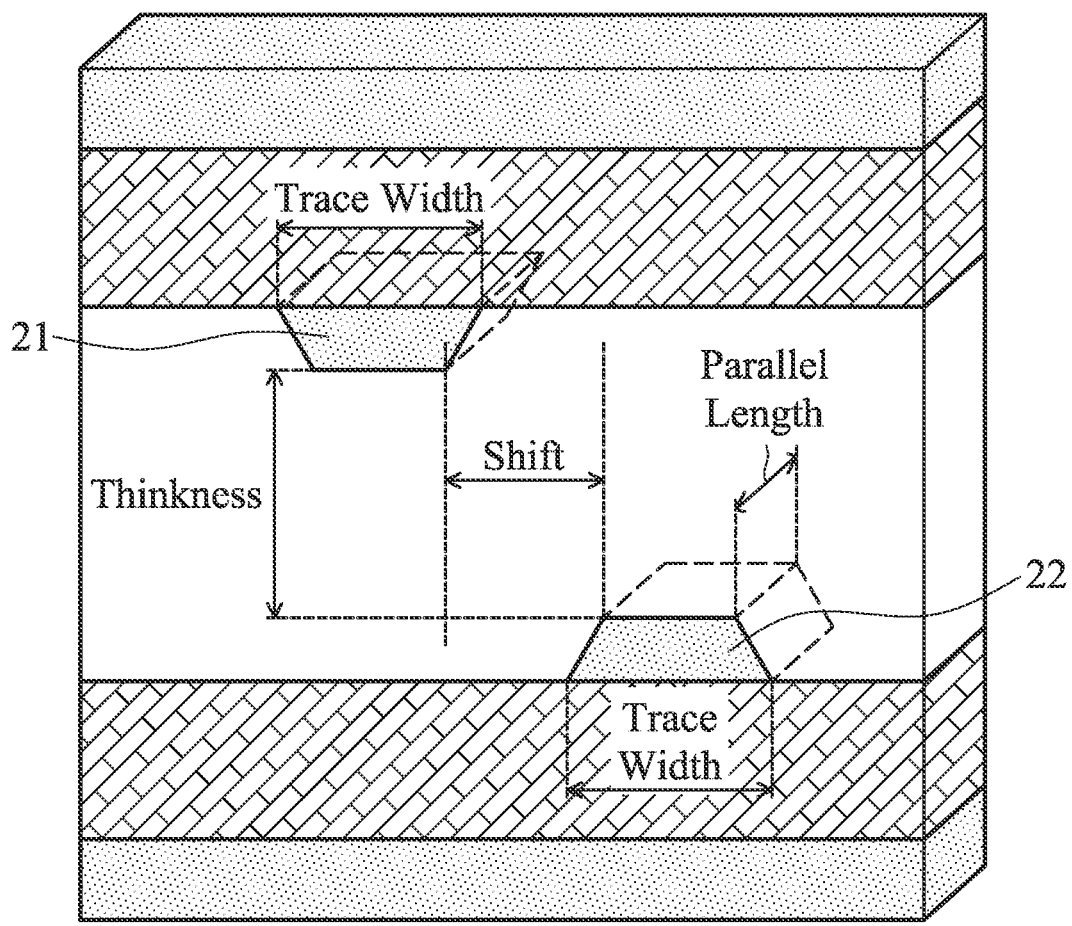
FIG. 2 is a schematic diagram showing another layout of dual stripeline difference layers.

FIG. 2 is a schematic diagram showing another layout of dual stripeline difference layers. The parameters related to the crosstalk are explained in FIG. 2. In FIG. 2, a shift, a thickness and a relative distance exist between the signal line 21 and the signal line 22. The relative distance can be estimated by the following equation:

$$\text{Relative Distance (mil)} = (\text{Shift}^2 + \text{Thinkness}^2)^{0.5}$$

Furthermore, the crosstalk is related to trace widths of the signal lines 21 and 22, and a parallel length between the signal lines 21 and 22. Moreover a database storing parameters of each line segment of the layout may be created to reduce the time for estimating the crosstalk of each line segment. Please refer to FIG. 3. FIG. 3 is a schematic diagram showing a form in a database that provides parameters for calculating a crosstalk according to an embodiment of the disclosure. In FIG. 3, the operating voltage and the rise time are input by the engineer. The parameters of trace width, thickness, shift and parallel length can be provided by layout software. In another embodiment, the crosstalk analysis software acquires the parameters from the layout software. In other embodiments, the parameters can be obtained by the crosstalk analysis software. For example, when the layout software generates a layout, the crosstalk analysis software estimates the length of each line segment and a distance between any two line segments with the help of a coordinate system.

Figure 4A:
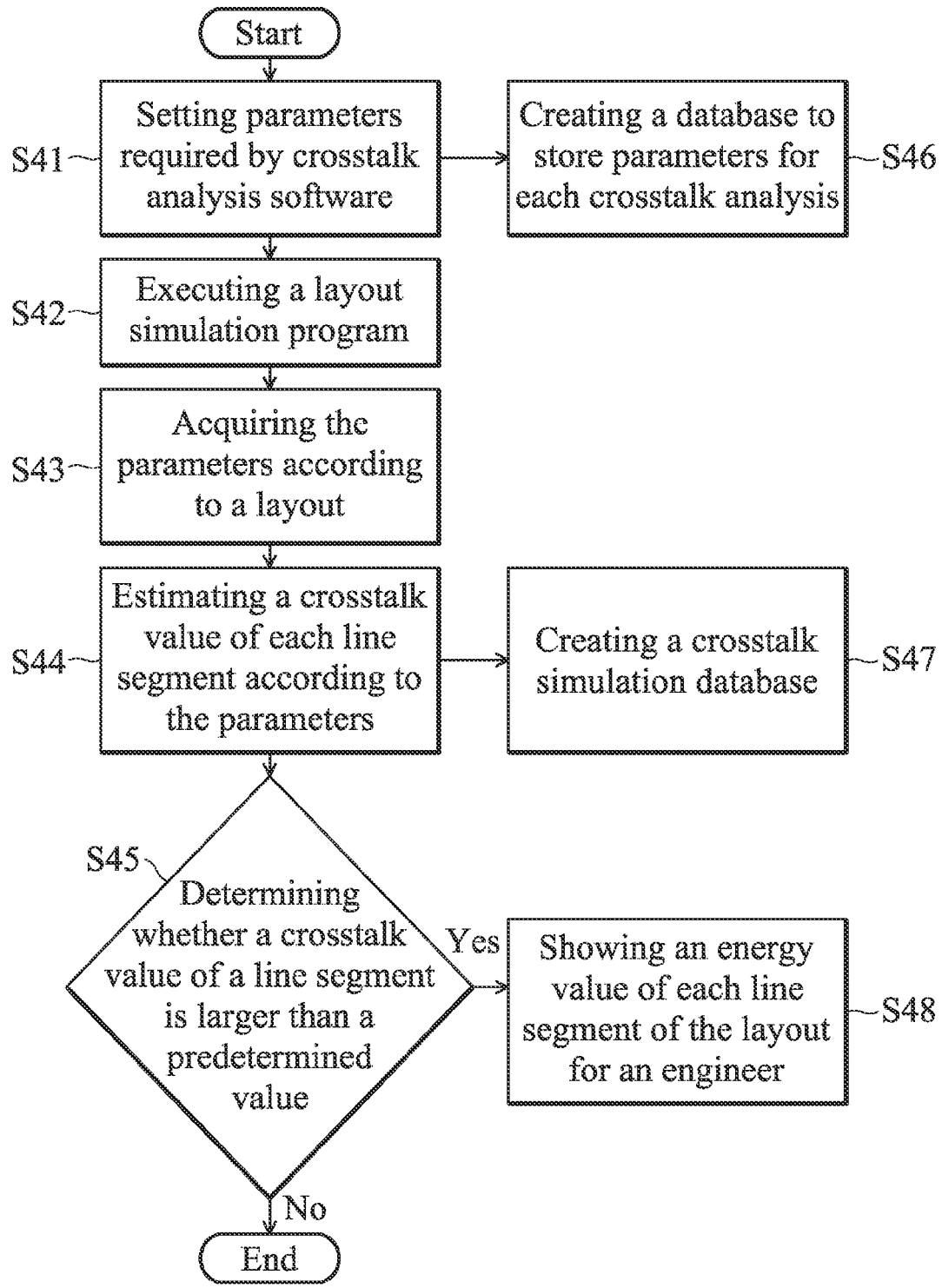
FIG. 4A is a flowchart of a crosstalk analysis method according to an embodiment of the disclosure.

FIG. 4A is a flowchart of a crosstalk analysis method according to an embodiment of the disclosure. In step S41, the user sets the parameters required by a crosstalk analysis software. The parameters include trace width, shift and parallel length, name of the line segment, operating voltage, rise time and others. Simultaneously, in step S46, a database is created to store parameters for each crosstalk analysis. In step S42, the user executes a layout simulation program. When the user completes a layout design, the user compiles the layout design via the layout simulation program and then, step S43 is executed. In step S43, a crosstalk program is executed and the layout design is analyzed according to the parameters set in step S41. The crosstalk program may require the layout simulation program to provide the parameters. If necessary, the crosstalk program may require a user to input some parameters via a pop-out window generated by the crosstalk program.

In step S44, the crosstalk program estimates a crosstalk value of each line segment according to the parameters. An embodiment of a crosstalk estimation equation is provided in the following:

$$FXTLK(mV)=346+15.3*Relative$$

$$Distance(mil)-161*Relative$$

$$Distance(mil)^{\wedge}0.5+7.21*Trace$$

$$Width(mil)-3.40*Rise(ps)^{\wedge}0.5+27.1*Work$$

$$Voltage(V)+1.07*Parallel\ Length(mil)^{\wedge}0.5$$

The meaning of each parameter is explained in the following.

FXTLK(mV): Far end crosstalk. Generally speaking, the amplitude of the far end crosstalk may affect the quality of signal clearly.

Relative Distance(mil): The distance between an interference source line and a signal line affected by the interference source line.

Trace Width(mil): The width of the interference source line.

Rise(ps): The rise time of the interference signal. The rise time is the duration for the voltage to be increased from 20% to 80% of the maximum voltage of the output voltage.

Working Voltage(V): The maximum voltage of the output voltage.

When step S44 is executed, the crosstalk program also executes step S47. The calculated results are stored in a crosstalk simulation database. For example, assuming the name of the circuit board designed by a user is Project_1, the crosstalk simulation database creates a database corresponding to the Project_1, and stores simulation results and parameters of the circuit board. In step S45, the crosstalk analysis program determines whether a crosstalk value of a line segment is larger than a predetermined value. If not, the crosstalk analysis of the line segments is finished. If the crosstalk value of the line segments is larger than a predetermined value, step S48 is executed. In step S48, the crosstalk analysis program shows an energy value of each line segment of the layout for an engineer to modify. In this embodiment, the crosstalk program and the layout program are executed simultaneously. The crosstalk program transmits specific parameters to the layout program and the layout program can label the line segment having a crosstalk value which is larger than the predetermined value in a different color. In another embodiment, the crosstalk program only shows the crosstalk values of the line segments having a crosstalk value which is larger than the predetermined value in the layout.

Figure 4B:
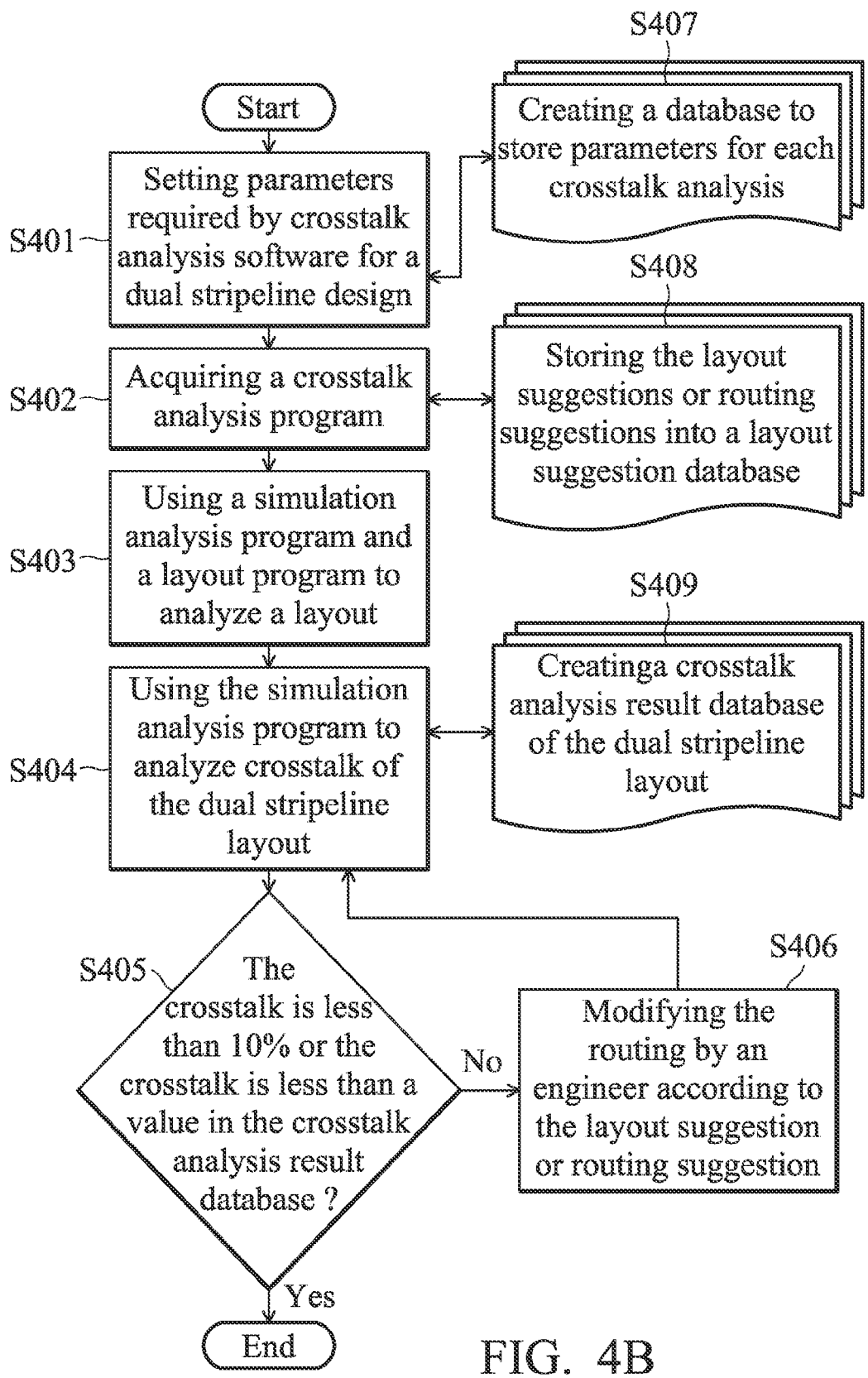
FIG. 4B is a flowchart of a crosstalk analysis method according to another embodiment of the disclosure.

FIG. 4B is a flowchart of a crosstalk analysis method according to another embodiment of the disclosure. In step S401, the user sets the parameters required by a crosstalk analysis program. The parameters include trace width, shift and parallel length, name of the line segment, operating voltage, rise time and others. Simultaneously, in step S407, a database is created to store parameters for each crosstalk analysis. For example, the user can store crosstalk parameters of important signal lines or all the signal lines of a chipset in the database. When the user executes a crosstalk analysis program, the user can load the parameters of the chipset from the database automatically or manually. In this embodiment, the crosstalk parameters of other controller or circuit elements are also stored in the database.

In step S402, the user acquires a crosstalk analysis program to analyze the crosstalk values and provides layout suggestions or routing suggestions to reduce the crosstalk of the dual stripeline layout. In step S408, the user stores the layout suggestions or routing suggestions into a layout suggestion database for the engineer to modify the layout or routing. In step S403, the user uses a simulation analysis program and a layout program to analyze a layout. Then, in step S404, the user uses the simulation analysis program to analyze crosstalk of the dual stripeline layout.

The user can also create a crosstalk analysis result database of the dual stripeline layout in step S409. Therefore, the user can use previous analysis results as a baseline to analyze the current analysis result. For example, assuming a crosstalk value of a signal line was 8% for a previous analysis result, and is 10% for the current analysis result, the user has to determine whether the routing has to be modified for the current layout.

In step S405, the simulation analysis program determines whether the crosstalk of a signal in the layout is less than 10% or the crosstalk is less than corresponding value stored in the crosstalk analysis result database. If yes, the simulation analysis is finished. If not, step S406 is executed. In step S406, the layout engineer can modify the routing according to the layout suggestion or routing suggestion.

Figure 5:
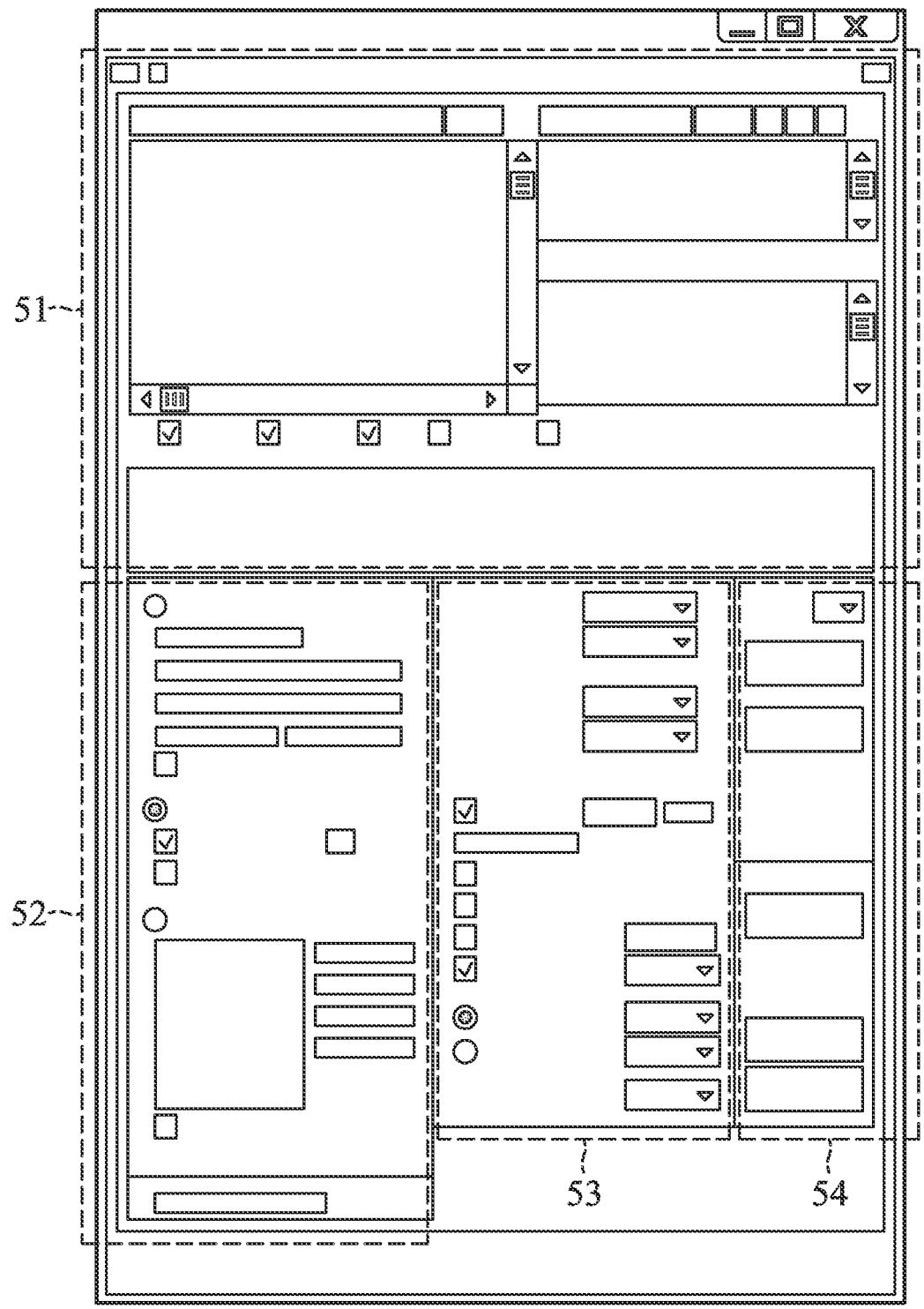
FIG. 5 shows an interface of a crosstalk analysis program according to an embodiment of the disclosure.

FIG. 5 shows an interface of a crosstalk analysis program according to an embodiment of the disclosure. The interface of the crosstalk analysis program mainly comprises five parts. The area 51 shows the analysis result of the crosstalk analysis program. When a crosstalk of a line segment is larger than a predetermined value, the related information of the line segments will be shown in area 51. The area 52 shows the information setting of the line segments to be analyzed. The area 53 shows the parameter setting of the line segments to be analyzed. The area 54 shows the commands of the crosstalk analysis program. For detail descriptions and explanations of areas 51-54, reference may be made to FIGS. 5A-5D.

FIG. 5A shows an interface of a crosstalk analysis program according to another embodiment of the disclosure. FIG. 5A described the functions in the area 51. The Victim Aggressor List shows the line segments having a larger crosstalk than a predetermined value. NR is a noise ratio. A user can set the NR threshold of line segments that will be shown in the Victim Aggressor List. The NR threshold may be less than 5%, between 5% and 10%, or more than 10%. In other words, the Victim Aggressor List shows the line segments having an NR that is less than 5%, more than 10% or between 5% and 10%. When the user selects the line segment in the Victim Aggressor List, the field INFOR and the information field at a right side show the information of the selected line segment.

FIG. 5B shows an interface of a crosstalk analysis program according to another embodiment of the disclosure. A user can select a signal to be analyzed via the fields in the FIG. 5B. A user can select the field "Check All Nets" to analyze all of the signals or input the name of signals that do not need to be analyzed in the field "Exclude Net Name". In other embodiments, the user can directly input the signal or signal group to be analyzed. A user can use the field or function "Edit/Creak" to create signal groups.

FIG. 5C shows an interface of a crosstalk analysis program according to another embodiment of the disclosure. A user can set the layer having a signal line to be analyzed and the layer where an interference line is at via the fields Layer Pair 1 and Layer Pair 2. Furthermore, the user can input the thickness of each layer in the field "Dielectric Thickness". The user can also input a first predetermined value of a parallel length of the signal line and the interference line. Only when the parallel length of the signal line and the interference line is larger than the first predetermined value, the crosstalk analysis is executed. The user can also set a second predetermined value of the signal line and the interference line and only when a shift value between the signal line and the interference line is larger than the second predetermined value, will the crosstalk analysis program analyze the signal line. The user can also set a third predetermined value of the signal line and the interference line and only when a distance value between the signal line and the interference line is less than the second predetermined value, will the crosstalk analysis program analyze the signal line.

Figure 5D:
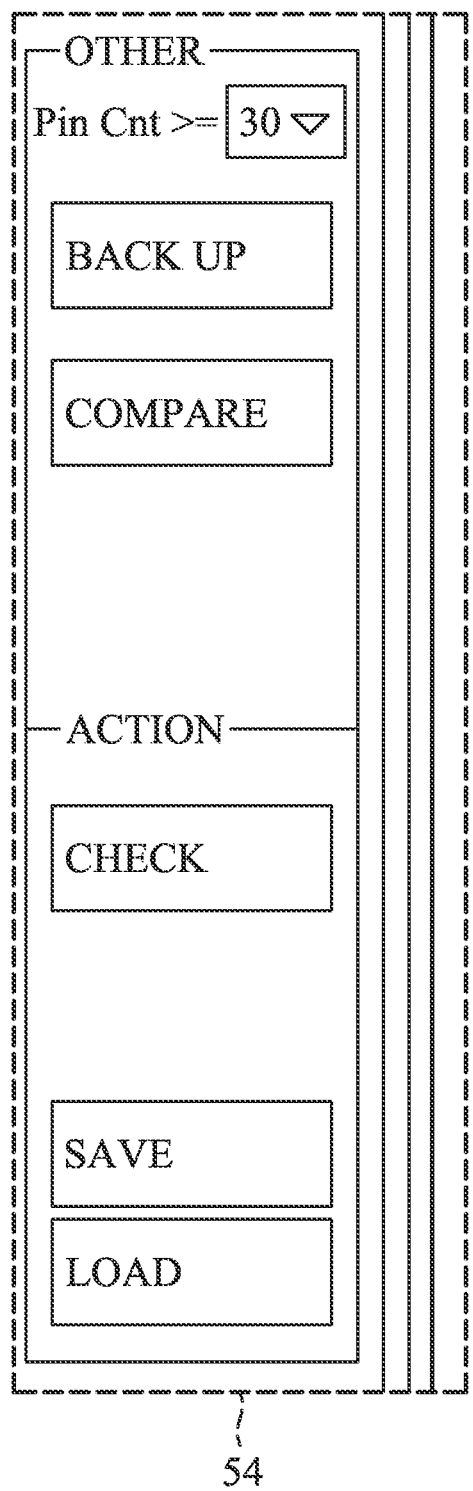
FIG. 5D shows an interface of a crosstalk analysis program according to another embodiment of the disclosure.

FIG. 5D shows an interface of a crosstalk analysis program according to another embodiment of the disclosure. FIG. 5D shows some commands of the crosstalk analysis program. A user can use the "BACK UP" command to back up the analysis result or load a previous analysis result via a "LOAD" command. When the user finishes setting the parameters required for the crosstalk analysis program, the user clicks the "CHECK: button to start the analysis.

Figure 6:
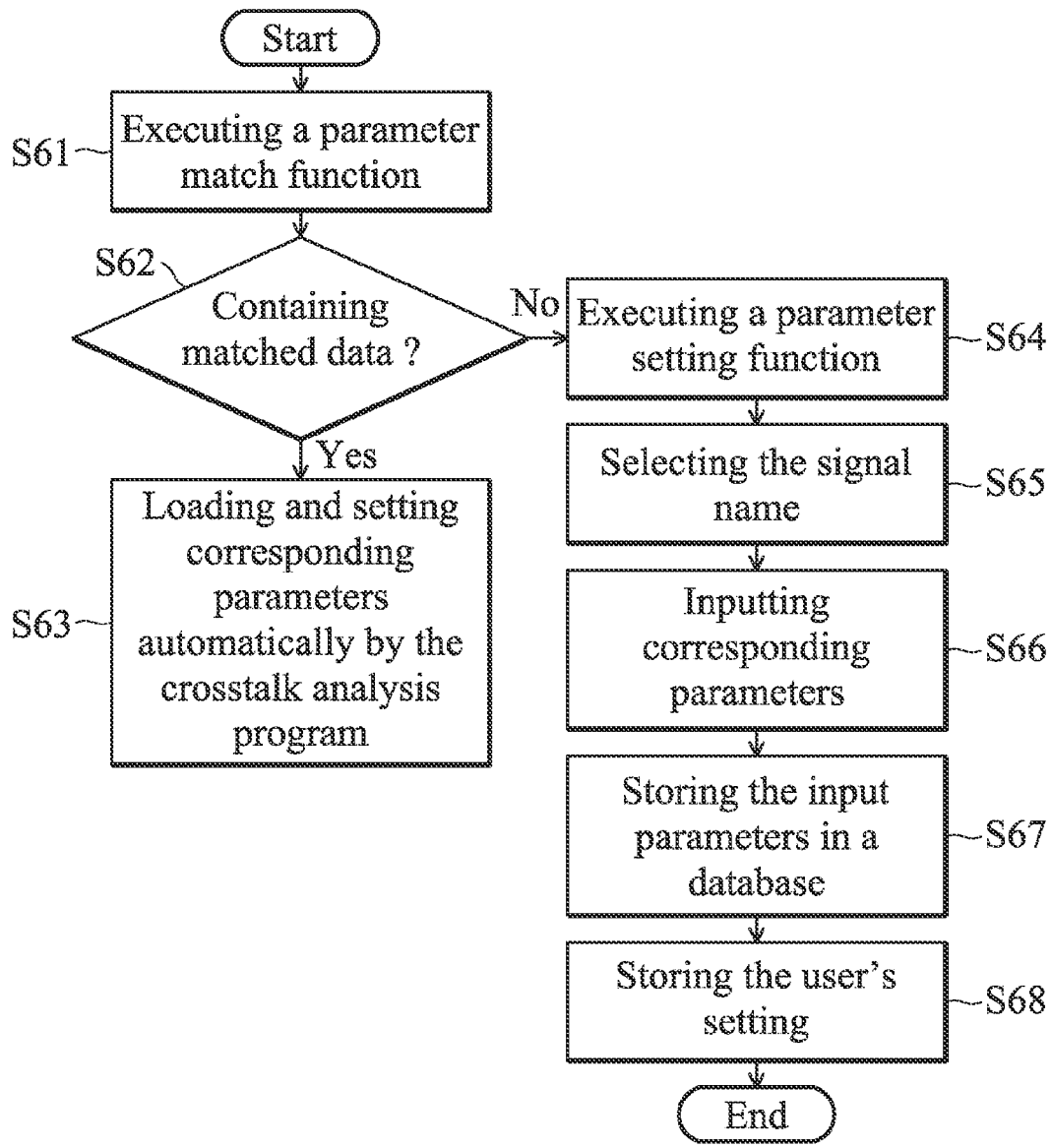
FIG. 6 is a flowchart for setting parameters for a crosstalk analysis according to an embodiment of the disclosure.

FIG. 6 is a flowchart for setting parameters for a crosstalk analysis according to an embodiment of the disclosure. In step S61, a parameter match function is executed. The crosstalk analysis program executes the function according to the name of the circuit that the user wants to analyze. In step S62, the crosstalk analysis determines whether the database contains matched data. If yes, step S63 is executed and the crosstalk analysis program automatically loads and sets corresponding parameters. If not, step S64 is executed. In step S64, a parameter setting function is executed. In step S65, the user selects the signal name and inputs corresponding parameters in step S66. The input parameters may be the parameters listed in FIG. 3. In step S67, the input parameters are stored in a database. In step S68, the crosstalk analysis program stores the user's input parameters.

Figure 7:
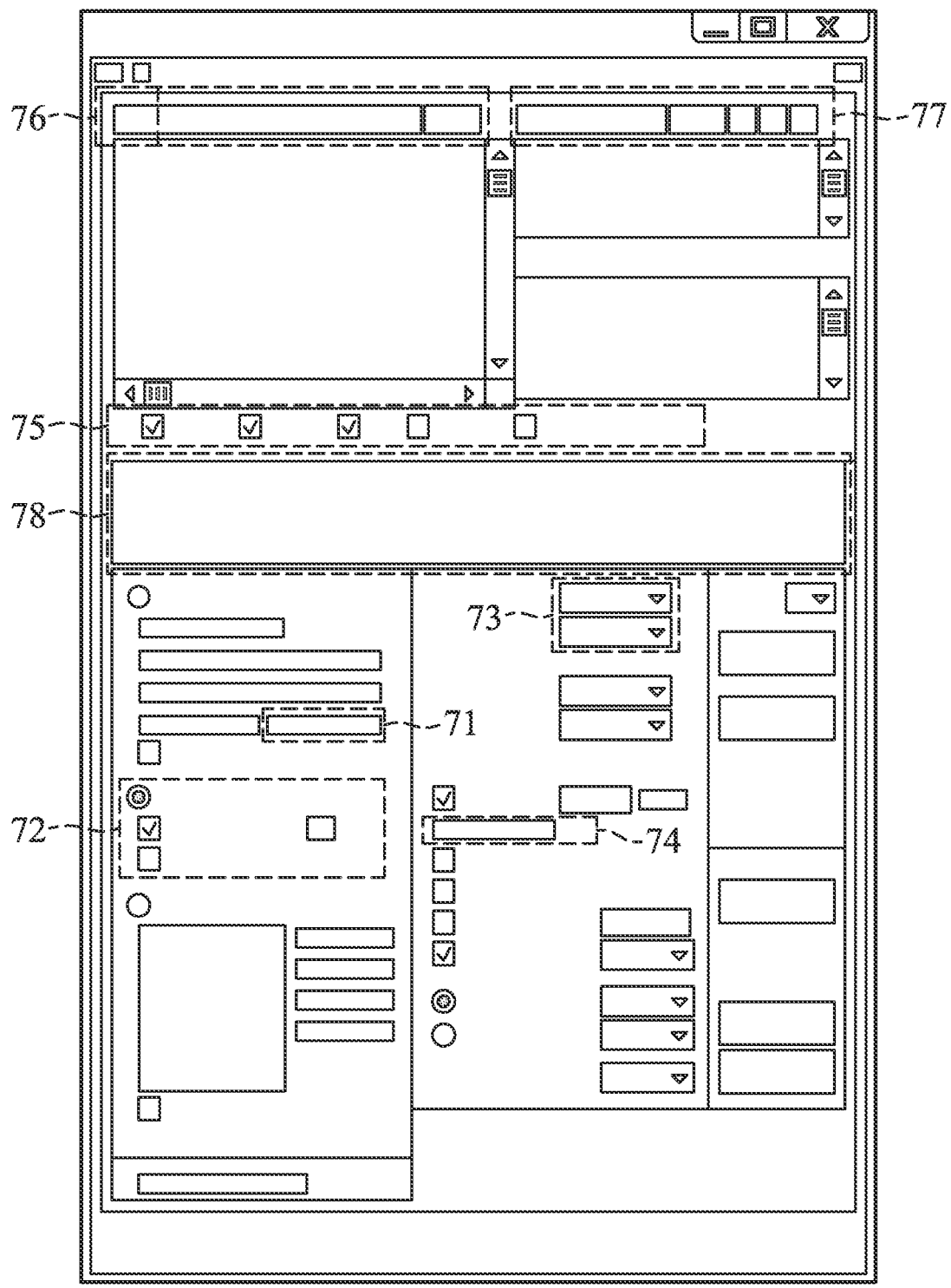
FIG. 7 shows an interface of a crosstalk analysis program according to another embodiment of the disclosure.

FIG. 7 shows an interface of a crosstalk analysis program according to another embodiment of the disclosure. Note that only a schematic diagram is shown in FIG. 7 and reference may be made to FIGS. 7A and 7B for further detail. The following paragraph describes the meaning of the fields according to the operation of a crosstalk analysis program. First, the user loads the parameter configuration file set in FIG. 6 via the field 71 (Imo/Exo). Then, the user inputs the name of the signal that needs not be analyzed via the field 72 (Exclude Net Name). Next, the user sets the layers where the signal to be analyzed is at and corresponding parameters via field 73. In the field 74, the user sets or modifies the parameters of the signal. After setting the parameters, the user clicks the CHECK button in FIG. 7B to execute the crosstalk analysis.

Figure 7A:
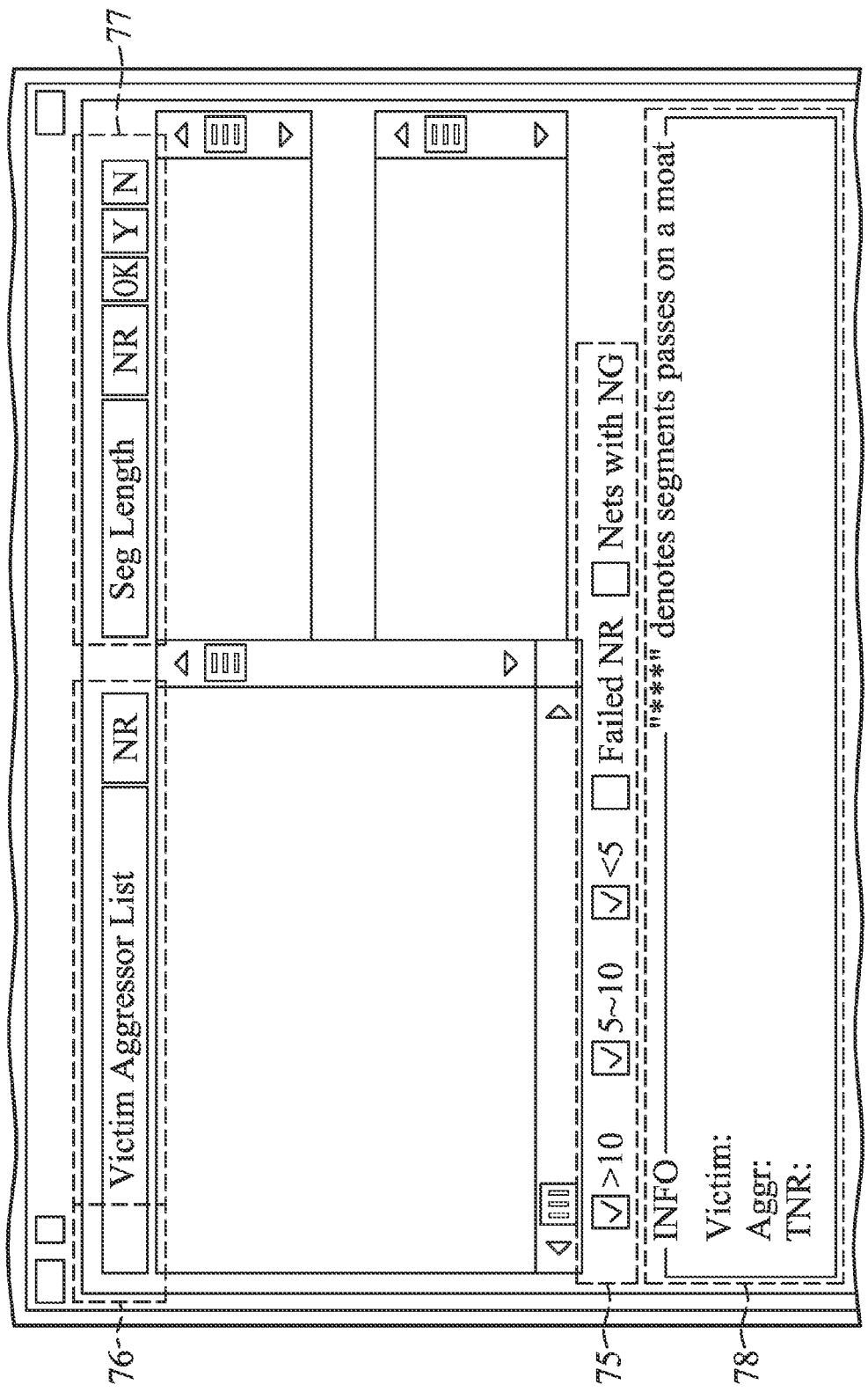
FIG. 7A shows an interface of a crosstalk analysis program according to another embodiment of the disclosure.

After the crosstalk analysis is completed, the analysis results are shown in FIG. 7A. Field 75 is provided to set the line segment to be shown in the Victim Aggressor List. A user can set the Victim Aggressor List to show the line segments having an NR that is less than 5%, more than 10% or between 5% and 10%. When an option "Failed NR" is selected, the crosstalk analysis program filters the analysis result and shows line segments having a larger crosstalk than a threshold, such as 5%. The Victim Aggressor List shows the line segments having a larger crosstalk than a predetermined value. NR is a noise ratio. The "Seg Length" in field 77 checks the line segments having a parallel length that is longer than 200 mils and determines whether the routing needs to be changed. Y means the routing needs to be changed and N means the routing doesn't need to be changed. The "INFO" in field 78 and the information field at the right side show information related to the signal selected in field 76.

The Victim Aggressor List shows the line segments having a larger crosstalk than a predetermined value. NR is a noise ratio. A user can set a NR threshold of line segments that will be shown in the Victim Aggressor List. The NR threshold may be less than 5%, between 5% and 10% or more than 10%. In other words, the Victim Aggressor List shows the line segments having an NR that is less than 5%, more than 10% or between 5% and 10%. When the user selects the line segment in the Victim Aggressor List, the field INFOR and the information field at the right side show the information of the selected line segment.

Figure 8:
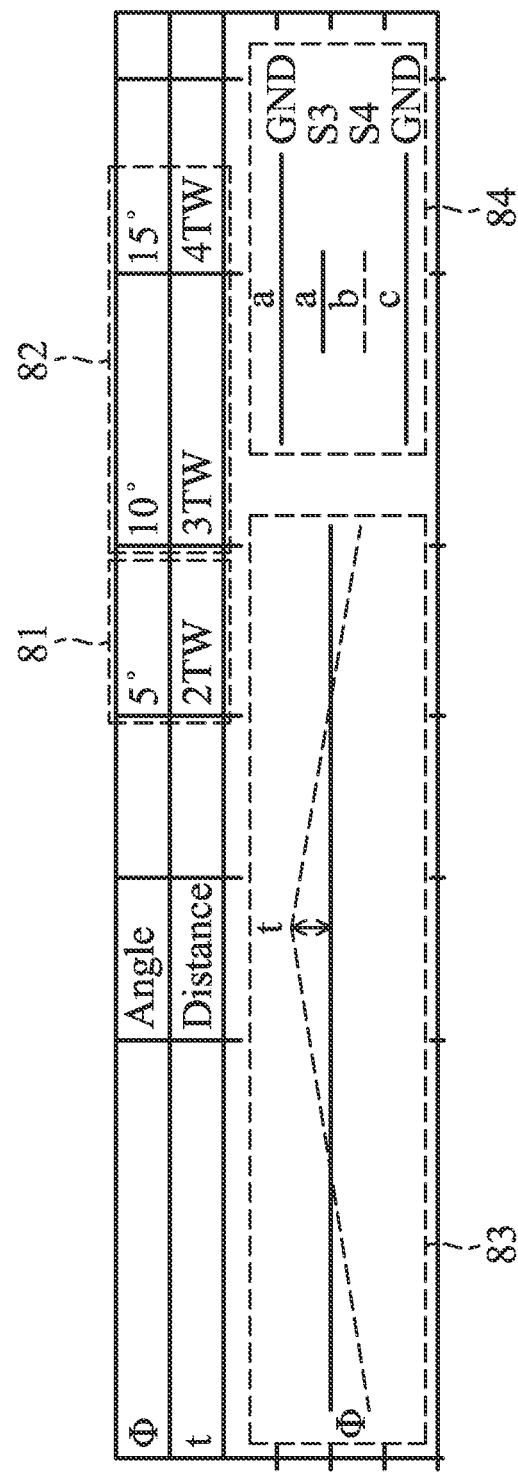
FIG. 8 is a schematic diagram showing a layout suggestion according to an embodiment of the disclosure.

FIG. 8 is a schematic diagram showing a layout suggestion according to an embodiment of the disclosure. As shown in FIG. 8, the layout suggestion is a layout suggestion table arranged to be provided to user when the crosstalk value is larger than a predetermined value (step 406). The layout suggestion table includes fields 81, 82, 83 and 84. The field 81 shows the routing that should be avoided. Namely, the field 81 shows the current layout parameters corresponding to a line segment, wherein the current layout parameters include an angle of the line segments and a minimum distance between the line segment and an interference source, and the crosstalk value of the line segment is larger than the predetermined value. The field 82 shows the suggested layout or routing by the crosstalk analysis program. Namely, the field 82 includes at least one layout-parameter set corresponding the line segment same as the field 81. The layout-parameter set comprises a plurality of layout parameters arranged to be provided for users to re-arrange the line segment to cause the crosstalk value of the line segment re-arranged with the layout parameters to be less than the predetermined value. Each of the layout-parameter sets includes an angle of the line segments and a minimum distance between the line segment and an interference source. The field 83 is the layout schematic of the line segment and the interference source line drawn with the lines corresponding to the different layers. The field 84 shows the lines of different layers GND, S3, S4, etc., but it is not limited thereto. The routing comprises an angle of the signal line and a minimum distance between the line segment and the interference source line.

Figure 9:
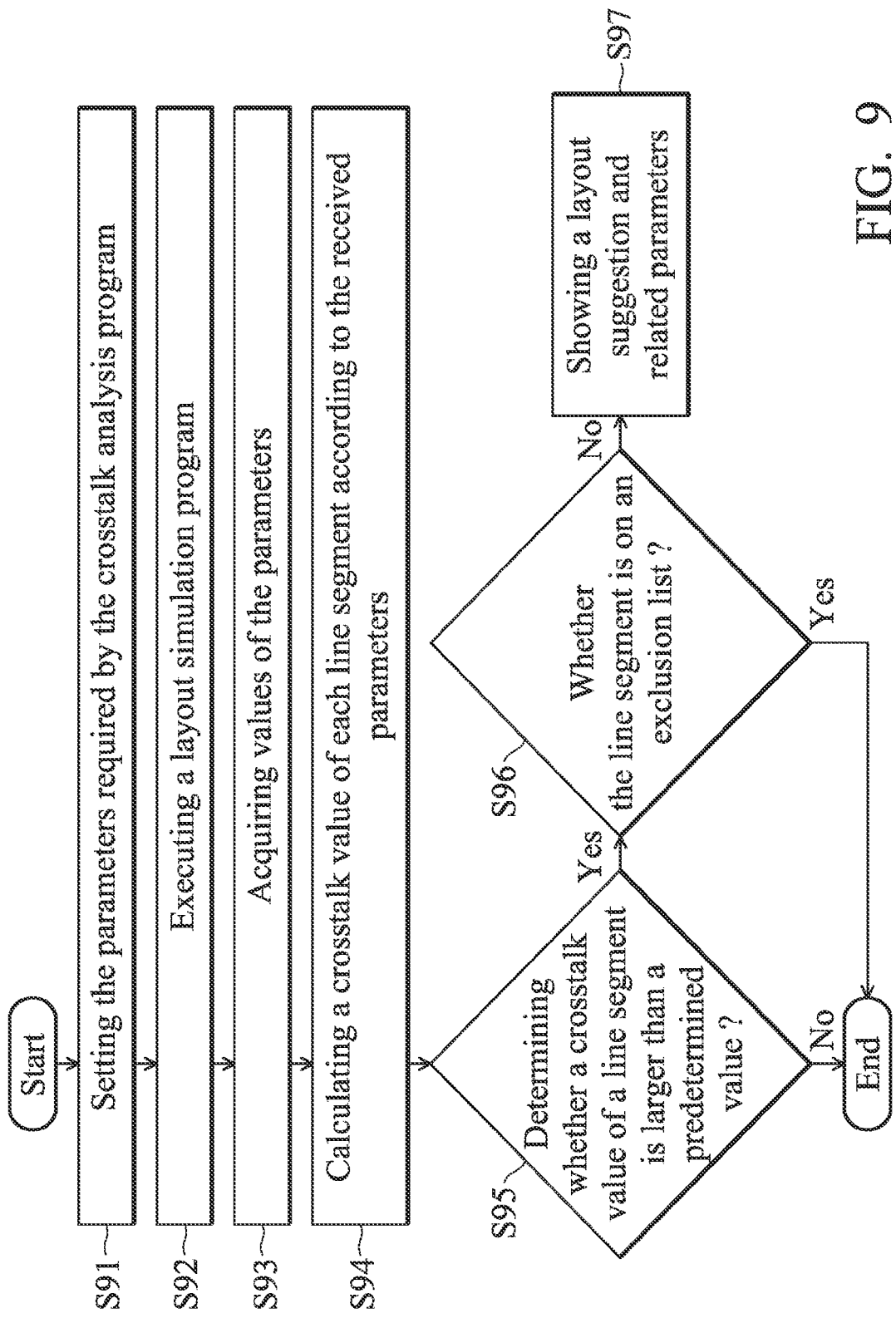
FIG. 9 is a flowchart of a crosstalk analysis method according to another embodiment of the disclosure.

FIG. 9 is a flowchart of a crosstalk analysis method according to another embodiment of the disclosure. In step S91, the user first sets the parameters required by the crosstalk analysis program. The parameters include trace width, shift and parallel length, name of the line segment, operating voltage, rise time and others. In step S92, the user executes a layout simulation program. When the user completes a layout design, the user compiles the layout design via the layout simulation program and step S93 is executed simultaneously. In step S93, a crosstalk analysis program is executed and acquires values of the parameters set in step S91 from the layout simulation program. If any parameter value needs to be input by the user, a window pops up for the user.

In step S94, the crosstalk analysis program calculates a crosstalk value of each line segment according to the received parameters.

In step S95, the crosstalk analysis program determines whether a crosstalk value of a line segment is larger than a predetermined value. If not, the crosstalk analysis of the line segment is finished. If the crosstalk value of the line segment is larger than a predetermined value, step S96 is executed. In step S96, the crosstalk analysis program first determiners whether the line segment is on an exclusion list. The exclusion list records at least one line segment which does not need to be analyzed by the crosstalk analysis program. If the line segment is on the exclusion list, the crosstalk analysis is finished. If not, step S97 is executed. In step S97, the crosstalk analysis program labels the line segment and shows a layout suggestion and related parameters. In this embodiment, the crosstalk program and the layout program are executed simultaneously. The crosstalk program transmits specific parameters to the layout program and the layout program can label the line segment having a crosstalk value which is larger than the predetermined value in a different color.

Figure 10:
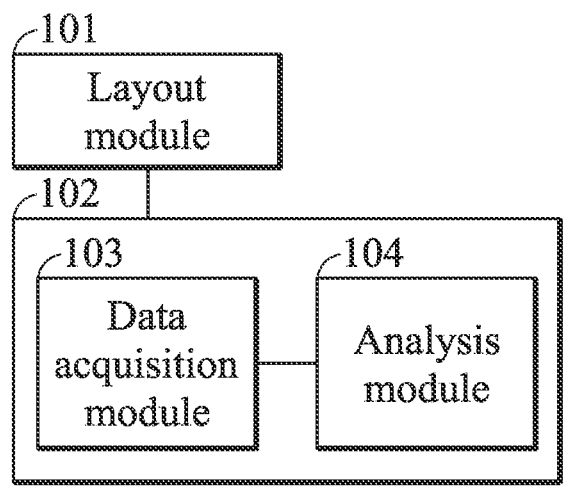
FIG. 10 is a schematic diagram of a crosstalk analysis device according to an embodiment of the disclosure.

FIG. 10 is a schematic diagram of a crosstalk analysis device according to an embodiment of the disclosure. The crosstalk analysis device comprises a layout module 101 and a crosstalk analysis module 102. Notably, the layout module 101 and the crosstalk analysis module 102 may be implemented by hardware or a program, list of codes or software executed by a processor or a controller. The layout module 101 generates a layout according to input data of a user. The crosstalk analysis module 102 receives the layout and executes a crosstalk analysis program. The crosstalk analysis module 102 comprises a data acquisition module 103 and an analysis module 104. The data acquisition module 103 acquires parameters from a layout generated by the layout module 101 and transmits the received parameters to the analysis module 104 for processing. Notably, the described module may be implemented by hardware or a program, list of codes or software executed by a processor or a controller.

Figure 11:
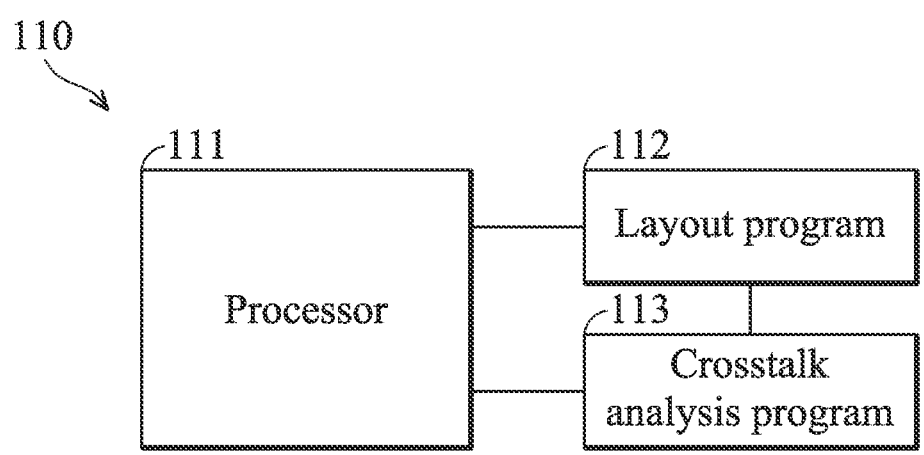
FIG. 11 is a schematic diagram of a computer using the crosstalk analysis program.

FIG. 11 is a schematic diagram of a computer using the crosstalk analysis program according to an embodiment of the disclosure. The computer 110 comprises a processor 111, a layout program 112 and a crosstalk analysis program 113. The layout program 112 and the crosstalk analysis program 113 are executed by the processor. When the layout program 112 compiles a layout, the crosstalk program is activated and acquires necessary parameters from the layout generated by the layout program 112 or input by the user. Then, the crosstalk analysis program 113 executes crosstalk analysis according to the received parameters and provides a layout suggestion.

Figure 12:
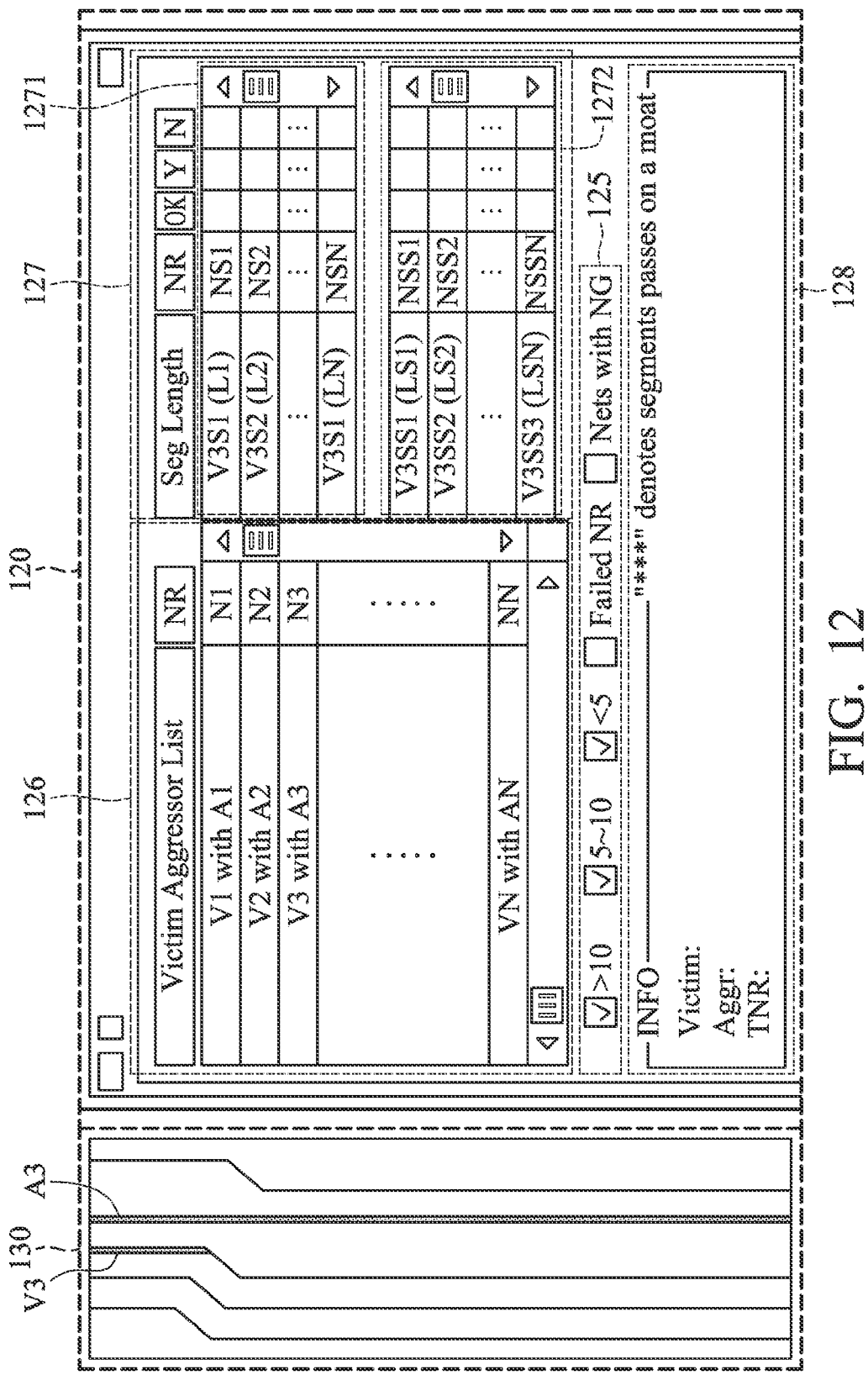
FIG. 12 shows an interface of a crosstalk analysis program according to another embodiment of the disclosure.

FIG. 12 shows an interface of a crosstalk analysis program according to another embodiment of the disclosure. FIG. 12 is another embodiment of FIG. 7A, such that the details of FIG. 12 may be referred to in FIG. 7A. The interface includes areas 120 and 130. The area 120 is arranged to show the parameters of lines. The area 130 is arranged to show the layout circuit, wherein the lines shown in the area 120 is the lines of the layout circuit of the area 130.

The area 120 includes fields 125, 126, 127 and 128. Field 125 is provided to set the line to be shown in the field 126 (Victim Aggressor List). A user can set the field 126 (Victim Aggressor List) to show the lines having an NR that is less than 5%, more than 10% or between 5% and 10%. When an option "Failed NR" is selected, the crosstalk analysis program filters the analysis result and shows lines having a larger crosstalk than a threshold, such as 5%. The Victim Aggressor List shows the Victim lines V1~VN with the Aggressor lines A1~AN and noise ratios N1~NN (NR) of the victim lines. Furthermore, users may select one of the Victim line with the Aggressor line in field 126, and the details of the selected line will be shown in field 127. The field 127 is arranged to show the line segments V3S1~V3SN and V3SS1~V3SSN of the selected line and the corresponding information. The field 1271 of the field 127 is arranged to show the line segments V3S1~V3SN having a parallel length that is longer than a predetermined length, such as 200 mils, but it is not limited thereto. The field 1272 of the field 127 is arranged to show the line segments V3SS1~V3SSN having a parallel length that is shorter than the predetermined length, such as 200 mils, but it is not limited thereto. NR is a noise ratio NS1~NSN and NSS1~NSSN of the corresponding line segments. OK is a check field arranged to record whether the user already check the corresponding line. Y means the routing needs to be changed. N means the routing doesn't need to be changed. The "INFO" in field 128 and the information field at the right side show information related to the signal selected in field 126.

The Victim Aggressor List shows the lines having a larger crosstalk than a predetermined value. NR is a noise ratio. A user can set a NR threshold of lines that will be shown in the Victim Aggressor List. The NR threshold may be less than 5%, between 5% and 10% or more than 10%. In other words, the Victim Aggressor List shows the lines having an NR that is less than 5%, more than 10% or between 5% and 10%. When the user selects the line V3 in the Victim Aggressor List, the field INFOR and the information field at the right side show the information of the selected line V3, and the field 127 shows the line segments V3S1~V3SN and V3SS1~V3SSN of the selected line V3 and the information of the line segments V3S1~V3SN and V3SS1~V3SSN. When the user selects the line segment V3S2, the area 130 shows the layout of the selected line segment V3 and high light the selected line segment V3. Therefore, the user can directly adjust (re-arrange) the lines by moving the lines on the area 130. Furthermore, the users may zoom in or zoom out the layout circuit displayed on the area 130 to adjust the lines of the layout circuit.

Figures 13, 14A:
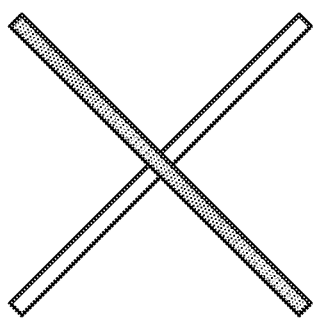
FIG. 13 shows a field of the interface of FIG. 12 according to another embodiment of the disclosure.
FIGS. 14A-14D shows the arrangement of lines according to an embodiment of the disclosure.
Figure 14B:
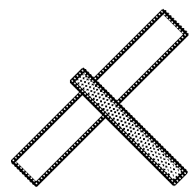
Figure 14C:
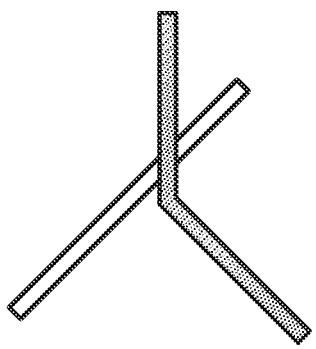
Figure 14D:
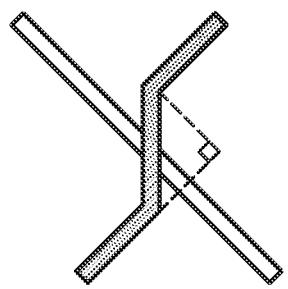

FIG. 13 shows a field of the interface of FIG. 12 according to another embodiment of the disclosure. The field 1272 of FIG. 13 is similar to the FIG. 12, except that the field NR is arranged to show the marker "X" which means the corresponding line segment may have misjudgment. In one embodiment, the misjudgment may be caused by the arrangement of lines, but it is not limited thereto.

FIGS. 14A-14D shows the arrangement of lines according to an embodiment of the disclosure. FIGS. 14A-14D show four ways that the line segments arranged to be crossed. The cross ways of line segments in FIG. 14A-14D may lead to some misjudgment. More specifically, the calculation may determine that the cross value of the lines in FIG. 14A-14D is over the predetermined value. However, it is a misjudgment. In fact, the cross value of the lines in FIG. 14A-14D may be less than the predetermined value. Therefore, the field NR of FIG. 13 shows the marker "X" when the corresponding line segment meets one of the embodiments of FIG. 14A~14D.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A crosstalk analysis method, comprising:
using a computer to perform the following:
executing a layout program for a layout circuit;
executing a crosstalk analysis program;
acquiring, by the crosstalk analysis program, a plurality of parameters from a layout result generated by the layout program;
estimating a crosstalk value according to the parameters;
determining whether the crosstalk value is larger than a predetermined value;
providing an interface for showing information of the layout result and adjusting a plurality of lines of the layout circuit, wherein the interface includes a first area arranged to display the parameters of the lines from the layout result and a second area arranged to display the layout circuit, wherein the layout circuit displayed in the second area is further arranged to be adjusted by users through the second area, the first area comprises a first field and a second field, wherein the first field is arranged to be provided to set the line to be shown in the second field, and the first area further comprises a third filed arranged to show a plurality of line segments of the selected line displayed on the second field and the corresponding information of the line segments.

2. The method as claimed in claim 1, wherein the third field further comprises a fourth field and a fifth field, the fourth field is arranged to display the line segments having a parallel length that is longer than a predetermined length, and the fifth field is arranged to display the line segments having a parallel length that is shorter than the predetermined length.

3. The method as claimed in claim 1, wherein the second area is arranged to highlight the line segment selected in the third field.

4. The method as claimed in claim 1, further comprising providing a layout suggestion table when the crosstalk value is larger than the predetermined value.

5. The method as claimed in claim 4, wherein the layout suggestion table comprises at least one layout-parameter set corresponding to at least one line segment of the lines, the crosstalk value of the line segment is larger than the predetermined value, and the layout-parameter set comprises a plurality of layout parameters.

6. The method as claimed in claim 5, wherein the layout parameters of each of the layout-parameter sets are arranged to be provided for users to re-arrange the line segment to cause the crosstalk value of the line segment re-arranged with the layout parameters to be less than the predetermined value.

7. The method as claimed in claim 6, wherein the layout parameters of each of the layout-parameter sets comprise an angle of the line segments and a minimum distance between the line segment and an interference source.

8. The method as claimed in claim 5, wherein the crosstalk value is caused by a signal coupling between an interference line segment and the line segment.

9. The method as claimed in claim 8, wherein the parameters comprise a horizontal displacement, a vertical displacement, a relative distance between the interference line segment and a first line segment, a layout layer of the first line segment and a width of the line segment.

10. The method as claimed in claim 1, further comprising providing a layout suggestion table when the crosstalk value is larger than the predetermined value.

11. The method as claimed in claim 10, wherein the layout suggestion table comprises at least one layout-parameter set corresponding to at least one line segment of the lines, the crosstalk value of the line segment is larger than the predetermined value, and the layout-parameter set comprises a plurality of layout parameters.

12. The method as claimed in claim 11, wherein the layout parameters of each of the layout-parameter sets are arranged to be provided for users to re-arrange the line segment to cause the crosstalk value of the line segment re-arranged with the layout parameters to be less than the predetermined value.

13. The method as claimed in claim 12, wherein the layout parameters of each of the layout-parameter sets comprise an angle of the line segments and a minimum distance between the line segment and an interference source.

14. The method as claimed in claim 11, wherein the crosstalk value is caused by a signal coupling between an interference line segment and the line segment.

15. The method as claimed in claim 14, wherein the parameters comprise a horizontal displacement, a vertical displacement, a relative distance between the interference line segment and a first line segment, a layout layer of the first line segment and a width of the line segment.

* * * * *